(12) United States Patent
Li

(10) Patent No.: US 8,780,048 B2
(45) Date of Patent: Jul. 15, 2014

(54) MEMBRANE KEYBOARD SCAN CIRCUIT, SCAN METHOD AND KEYBOARD HAVING THE SAME

(75) Inventor: Zhi-Qian Li, Beijing (CN)

(73) Assignee: Beijing Sigmachip Co., Ltd., Beijing (CN)

( * ) Notice: Subject to any disclaimer, the term of this patent is extended or adjusted under 35 U.S.C. 154(b) by 277 days.

(21) Appl. No.: 13/339,385

(22) Filed: Dec. 29, 2011

(65) Prior Publication Data

US 2012/0262376 A1 Oct. 18, 2012

(30) Foreign Application Priority Data

Apr. 14, 2011 (CN) .......................... 2011 1 0093867

(51) Int. Cl.
*G09G 5/00* (2006.01)
*G06F 3/02* (2006.01)

(52) U.S. Cl.
USPC .......................................... 345/168; 345/156

(58) Field of Classification Search
USPC .................................................. 345/156–168
See application file for complete search history.

(56) References Cited

U.S. PATENT DOCUMENTS

| 5,514,842 | A  | * | 5/1996 | Sugii et al. ..................... 200/5 A |
| 6,810,579 | B2 |   | 11/2004 | Lu |
| 2010/0066572 | A1 | * | 3/2010 | Dietz et al. ....................... 341/34 |
| 2011/0309956 | A1 | * | 12/2011 | Westhues et al. ............... 341/22 |

* cited by examiner

*Primary Examiner* — Michael Pervan
*Assistant Examiner* — Andrew Lee
(74) *Attorney, Agent, or Firm* — CKC & Partners Co., Ltd.

(57) ABSTRACT

A membrane keyboard scan circuit, a scan method and a keyboard having the same are provided. A row scan-port circuit of the scan circuit comprises a first and a second select branches corresponding to a first type of the membrane keyboard and a second type of the membrane keyboard respectively. A column scan-port circuit of the scan circuit comprises a fifth switch connected between a power supply voltage and an output port of the row scan-port circuit and a sixth switch connected between a ground line and the output port. The column scan-port circuit performs a scan output process to provide a row-scan timing signal to a key circuit of the membrane keyboard such that one of the first and the second select branches generates a sensing signal when the key circuit is triggered.

20 Claims, 7 Drawing Sheets

MEMBRANE KEYBOARD SCAN CIRCUIT, SCAN METHOD AND KEYBOARD HAVING THE SAME

RELATED APPLICATIONS

This application claims priority to China Application Serial Number 201110093867.2, filed Apr. 14, 2011, which is herein incorporated by reference.

BACKGROUND

1. Technical Field

The present invention relates to a keyboard technology. More particularly, the present invention relates to a membrane keyboard scan circuit, a scan method for the membrane keyboard scan circuit, and a keyboard including the membrane keyboard scan circuit.

2. Description of Related Art

The membrane keyboard is a common computer keyboard in use today. The structure of the membrane keyboard is simple. In addition to a top cover, a down cover and keycaps, the membrane keyboard includes rubber domes, three membrane circuit boards and a chip on the circuit boards. The membrane circuit boards have conductive paste formed thereon. The top layer of the membrane circuit boards is one end of a switch, the bottom layer is the other end of the switch and the middle layer is a non-conductive plastic membrane having a plurality of round holes corresponding to the positions of the keys. When the keyboard is in use, a plurality of pressing modules (including keycaps, movable modules under the keycaps and rubber domes) are placed on the membrane circuit boards. When a finger presses one of the keycaps, the top layer and the bottom layer can conduct electricity since they contact each other to make the switch close. When the finger leaves the keycaps, the top layer and the bottom layer are separated such that the switch is open.

FIG. 1A is a schematic diagram of a conventional keyboard scan matrix 10. FIG. 1B is a schematic diagram depicting the conventional keyboard scan matrix 10 connected to a keyboard control chip 12 and a host 14.

The keyboard control chip 12 on the membrane circuit board performs a scan process to detect whether the keys are operated. The working voltage of the keyboard control chip 12 is generally 5V. After the chip detects that a key is operated through the scanning process, the chip transmits a corresponding encoded signal to the host 14. There are generally 18 column scan-ports (C0-C17) and 8 row scan-ports (P0-P7) in a common keyboard control chip 12. The manner in which the ports are connected to the keyboard scan matrix 10 and the chip keyboard control 12 is shown in FIG. 1B.

FIG. 2 is a scan timing diagram of the column scan-ports (C0-C17) depicted in FIG. 1A. FIG. 3 is a conventional circuit diagram of one of the column scan-ports (C0-C17). Each of the column scan-ports (C0-C17) is a bi-directional input/output port 3 having a pull-up resistor 30. A control signal is transmitted from the keyboard control chip 12 depicted in FIG. 1B to point I1, and a column scan timing is generated at point O1. When the keyboard control chip 12 is in operation, each of the 18 column scan-ports outputs a low voltage level in turn, as shown in FIG. 2. When the scan process is performed, the bi-directional input/output 3 output a low voltage level and a high impedance state. For example, the column scan-port C0 outputs low voltage level in time period T1 and outputs high impedance state in time period T2. The column scan-port C1 outputs low voltage level in time period T2 and outputs high impedance state in time period T3. When the high impedance state is output, a high voltage level is generated from the bi-directional input/output port 3 through the use of the pull-up resistor 30.

FIG. 4 is a conventional circuit diagram of one of the row scan-ports (P0-P17). Each of the 8 row scan-ports (P0-P17) is an input port 4 comprising a pull-up resistor R1 and an input voltage control W1. If one of the keys of the key circuit (S1-S144) in the keyboard scan matrix 10 is operated, a corresponding one of the row scan-ports (P0-P7) receives a corresponding low voltage level generated from the operated key. As a result, the keyboard control chip 12 can determine that the key has been operated in accordance to reception of the low voltage level of the row scan-port. A signal generated by the key circuit (S1-S144) is transmitted to point 12 of the input port 4. An output signal is generated at point O2 and is further transmitted to the host depicted in FIG. 1B after encoding. The resistance of the pull-up resistor R1 is about 10K Ohm to 50K Ohm. Generally, the effective input low voltage level of the input port 4 is 1V and the effective input high voltage is 2V. The input voltage level control circuit W1 can be implemented by a Schmitt circuit.

In order to lower the manufacturing cost of the keyboard, a carbon paste membrane is used since it is lower in cost than a silver paste membrane. However, the resistance of scan lines when a carbon paste membrane is used is larger than the resistance of scan lines when a silver paste membrane is used. In particular, the resistance of the scan lines when a silver paste membrane is used is generally less than 5K Ohm while the resistance of the scan lines is over 200K Ohm when a carbon paste membrane is used. Hence, the scan-port circuit and method adapted for use with the conventional silver paste membrane keyboard is not suitable for use with the carbon paste membrane keyboard.

SUMMARY

An aspect of the present disclosure is to provide a membrane keyboard scan circuit used in a membrane keyboard having a key circuit. The membrane keyboard scan circuit comprises a row scan-port circuit and a column scan-port circuit. The row scan-port circuit comprises a first select branch and a second select branch. The first select branch is configured to be close when the membrane keyboard is a first type of the membrane keyboard, wherein the first select branch comprises a first branch and a third branch. The first branch comprises a first switch and a first pull-up resistor connected to each other in series. The third branch comprises a first input voltage control circuit and a third switch connected to each other in series. The second select branch is configured to be close when the membrane keyboard is a second type of the membrane keyboard. The second select branch comprises a second branch and a fourth branch. The second branch is connected in parallel with the first branch between a first node and a second node, wherein the second branch comprises a second pull-up resistor having a different resistive value from that of the first pull-up resistor and a second switch connected to each other in series, and wherein the first node is connected to a power supply voltage. The fourth branch is connected in parallel with the third branch between a third node and a fourth node, wherein the fourth branch comprises a second input voltage control circuit and a fourth switch connected to each other in series, the third node is a row output port of the row scan-port circuit, the second node and the fourth node are connected to a signal input port that is further connected to the key circuit, and the second input voltage control circuit has a different effective low threshold voltage level from that of the first input voltage control circuit. The column scan-port circuit comprises a fifth switch and a sixth switch. The fifth switch is connected between the power supply voltage and a column output port of the column scan-port circuit. The sixth switch has a first end connected to ground and a second end connected to the column output port of the column scan-port circuit. The column scan-port circuit performs a scan output process repetitively to output a low voltage level in a first specific time period through the use of the fifth switch and the six switch and to output and maintain a high voltage level after the first specific time period to provide a row-scan timing signal to the key circuit of the membrane keyboard such that one of the first select branch and the second select branch generates a sensing signal when the key circuit is triggered.

Another aspect of the present disclosure is to provide a membrane keyboard. The membrane keyboard comprises a key circuit and a membrane keyboard scan circuit. The membrane keyboard scan circuit comprises a row scan-port circuit and a column scan-port circuit. The row scan-port circuit comprises a first select branch and a second select branch. The first select branch is configured to be close when the membrane keyboard is a first type of the membrane keyboard, wherein the first select branch comprises a first branch and a third branch. The first branch comprises a first switch and a first pull-up resistor connected to each other in series. The third branch comprises a first input voltage control circuit and a third switch connected to each other in series. The second select branch is configured to be close when the membrane keyboard is a second type of the membrane keyboard. The second select branch comprises a second branch and a fourth branch. The second branch is connected in parallel with the first branch between a first node and a second node, wherein the second branch comprises a second pull-up resistor having a different resistive value from that of the first pull-up resistor and a second switch connected to each other in series, and wherein the first node is connected to a power supply voltage. The fourth branch is connected in parallel with the third branch between a third node and a fourth node, wherein the fourth branch comprises a second input voltage control circuit and a fourth switch connected to each other in series, the third node is a row output port of the row scan-port circuit, the second node and the fourth node are connected to a signal input port that is further connected to the key circuit, and the second input voltage control circuit has a different effective low threshold voltage level from that of the first input voltage control circuit. The column scan-port circuit comprises a fifth switch and a sixth switch. The fifth switch is connected between the power supply voltage and a column output port of the column scan-port circuit. The sixth switch has a first end connected to ground and a second end connected to the column output port of the column scan-port circuit. The column scan-port circuit performs a scan output process repetitively to output a low voltage level in a first specific time period through the use of the fifth switch and the six switch and to output and maintain a high voltage level after the first specific time period to provide a row-scan timing signal to the key circuit of the membrane keyboard such that one of the first select branch and the second select branch generates a sensing signal when the key circuit is triggered.

Yet another aspect of the present disclosure is to provide a scan method for the membrane keyboard circuit. The scan method comprises the steps outlined below. A type of a membrane of a membrane keyboard having the membrane keyboard circuit is determined to generate a determination result. A select branch of the row scan-port circuit corresponding to the type of the membrane is selected according to the determination result. A scan output process is performed repetitively by using the column scan-port circuit to output a low voltage level in a first specific time period through the use of the fifth switch and the six switch and a high voltage level is outputted and maintained after the first specific time period to provide the row-scan timing signal to a key circuit of the membrane keyboard. The key circuit is sensed by using the selected select branch.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1A:
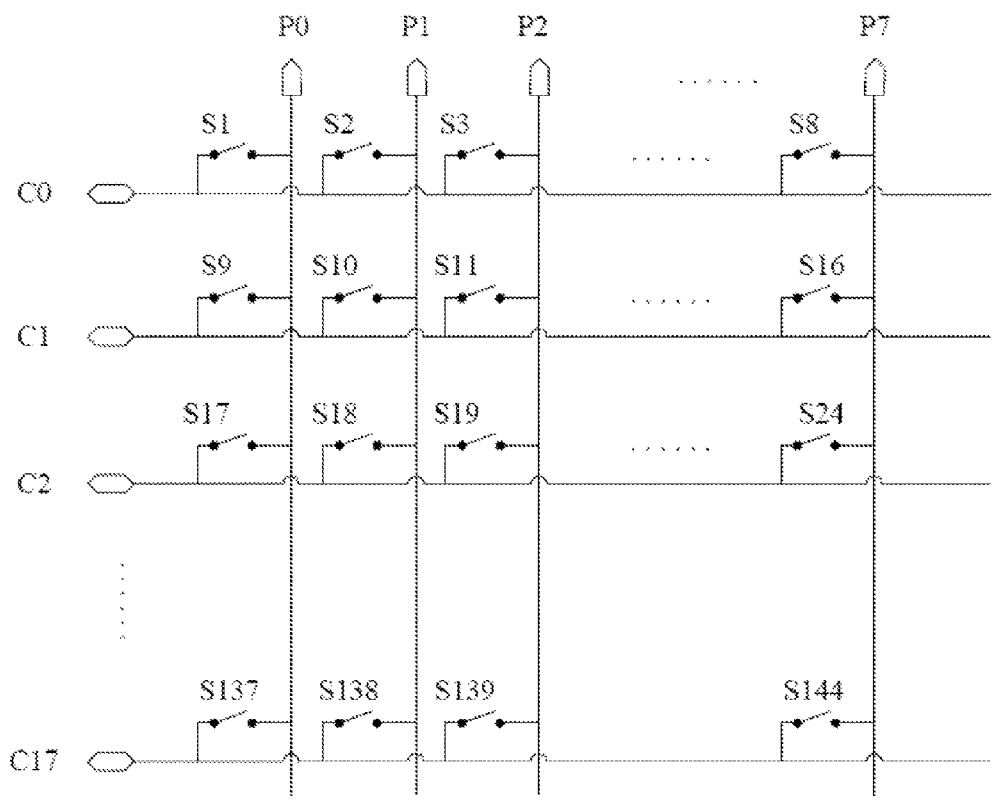
FIG. 1A is a schematic diagram of a conventional keyboard scan matrix.

Reference will now be made in detail to the present embodiments of the invention, examples of which are illustrated in the accompanying drawings. Wherever possible, the same reference numbers are used in the drawings and the description to refer to the same or like parts.

It should be appreciated that different combinations can be made according to different embodiments or according to different features in the embodiments when no contradiction is presented.

Figure 1B:
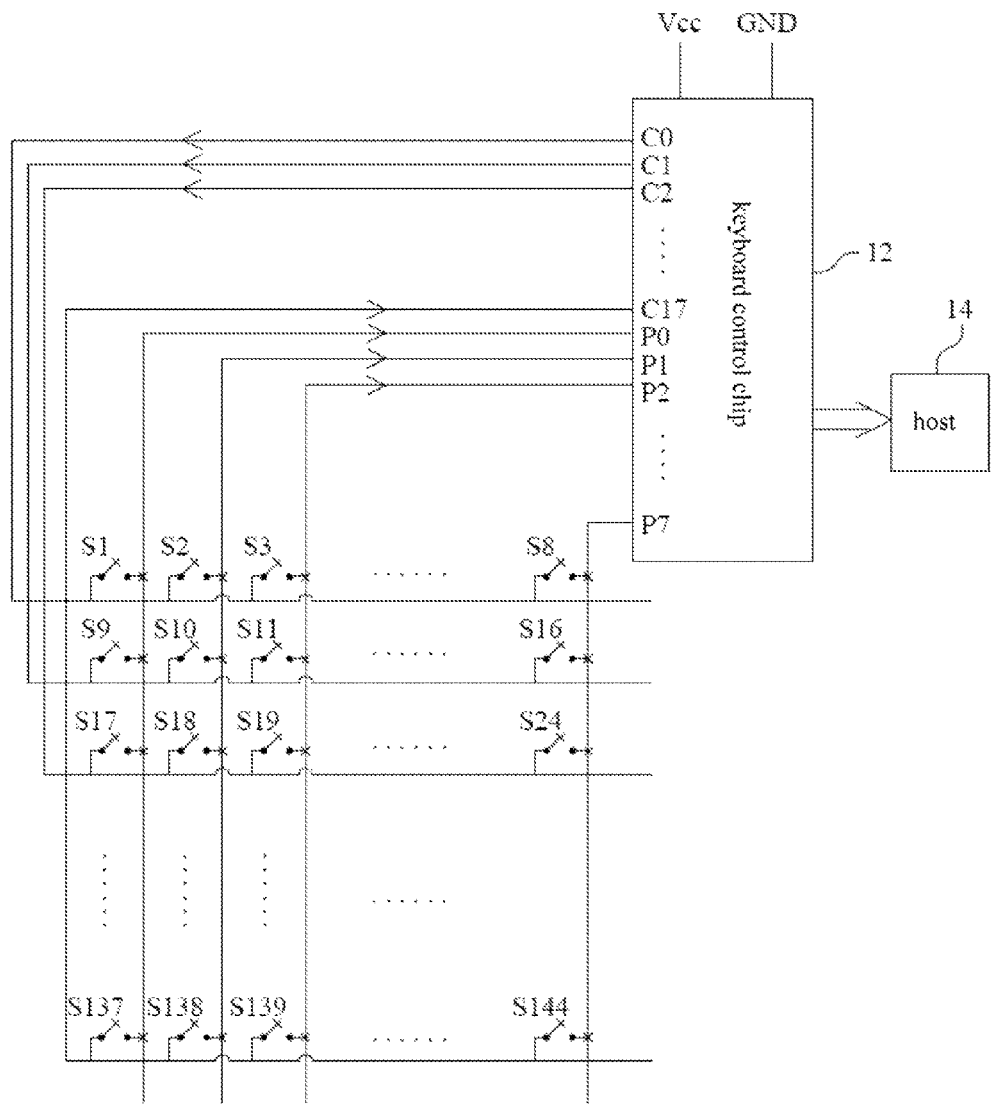
FIG. 1B is a schematic diagram depicting the conventional keyboard scan matrix connected to keyboard control chip and a host.
Figure 2:
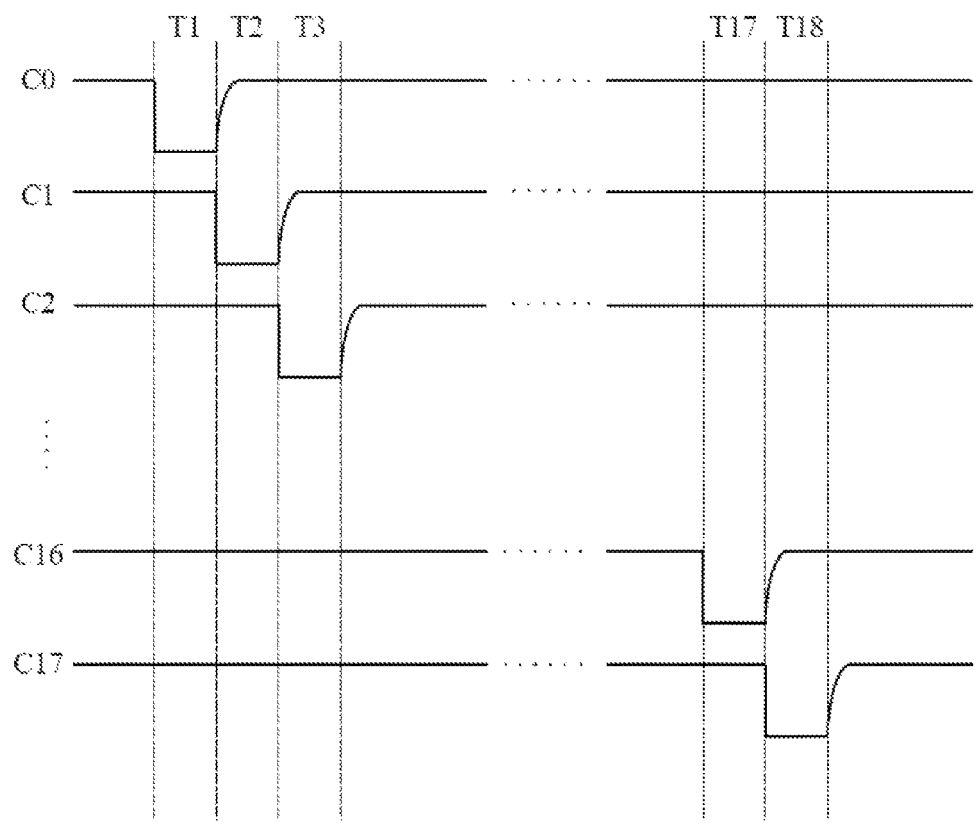
FIG. 2 is a scan timing diagram of the column scan-ports depicted in FIG. 1A.
Figure 3:
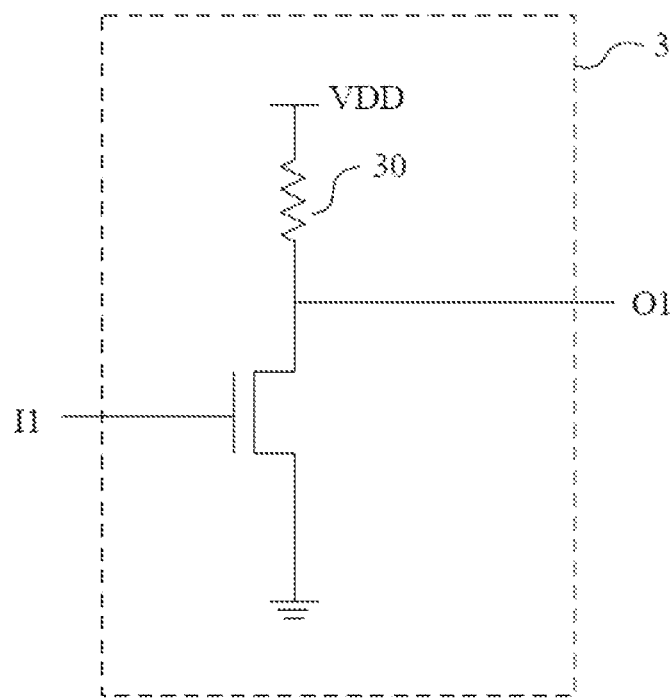
FIG. 3 is a conventional circuit diagram of one of the column scan-ports.
Figure 4:
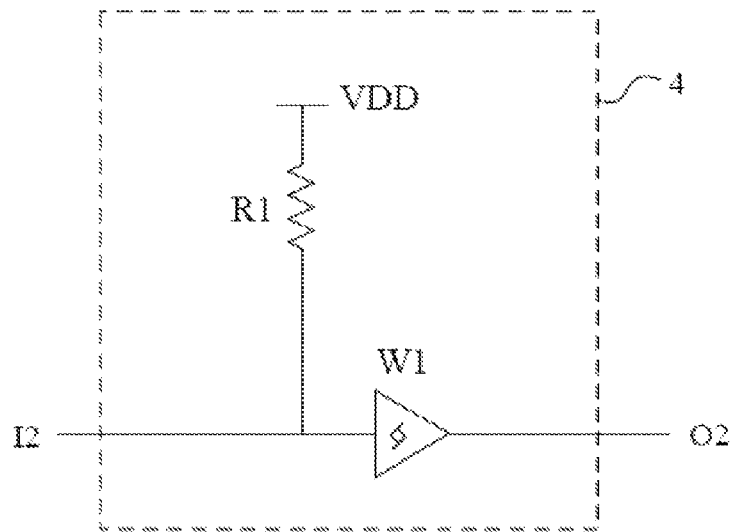
FIG. 4 is a conventional circuit diagram of one of the row scan-ports.

The membrane keyboard scan circuit in the present disclosure is suitable for different types of membrane keyboard. For example, the membrane keyboard scan circuit in the present disclosure is suitable for silver paste membrane keyboard and carbon paste membrane keyboard. The membrane keyboard scan circuit in the present disclosure comprises a column scan-port circuit 5 depicted in FIG. 5 and a row scan-port circuit 6 depicted in FIG. 6. The column scan-port circuit 5 and the row scan-port circuit 6 are connected to the key circuit (S1-S144), the keyboard control chip 12 and the host 14 depicted in FIG. 1B.

Figure 5:
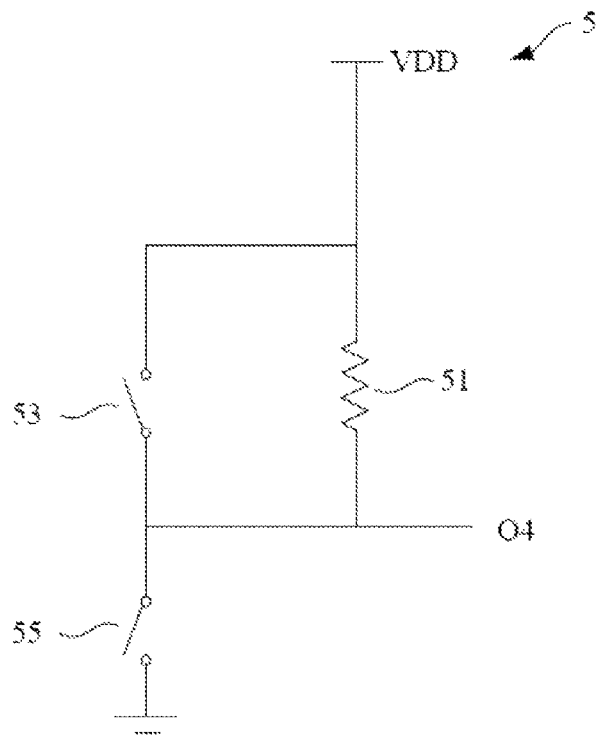
FIG. 5 is a circuit diagram of the column scan-port circuit in an embodiment of the present disclosure.

FIG. 5 is a circuit diagram of the column scan-port circuit 5 in an embodiment of the present disclosure. As shown in FIG. 5, the column scan-port circuit 5 has a third pull-up resistor 51, a fifth switch 53 and a sixth switch 55.

The fifth switch 53 is connected to the third pull-up resistor 51 in parallel between the power supply voltage VDD and a column output port O4 of the column scan-port circuit 5. The sixth switch 55 has a first end connected to ground and a second end connected to the column output port O4 of the column scan-port circuit 5. A column scan timing signal is generated at the column output port O4 of the column scan-port circuit 5 according to the operation status (e.g. open and close) of the fifth switch 53 and the sixth switch 55.

Figure 6:
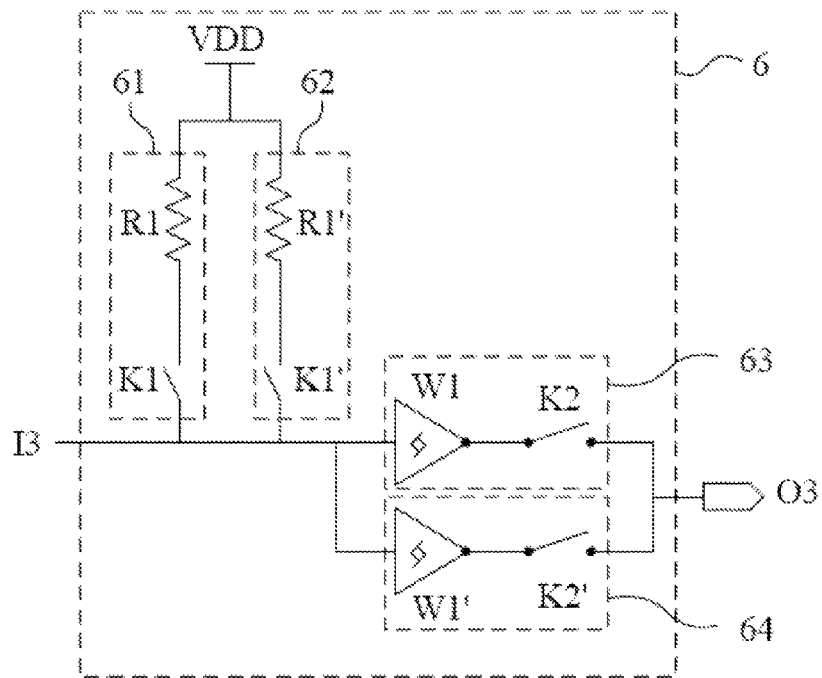
FIG. 6 is a circuit diagram of the row scan-port circuit.

FIG. 6 is a circuit diagram of the row scan-port circuit 6. As shown in FIG. 6, the row scan-port circuit 6 comprises a first select branch and a second select branch. The first select branch comprises a first branch 61 and a third branch 63. The second select branch comprises a second branch 62 and a fourth branch 64.

The first branch 61 has a first switch K1 and a first pull-up resistor R1 connected to each other in series. The second branch 62 is connected in parallel with the first branch 61 between a first node and a second node. The second branch 62 has a second switch K1' and a second pull-up resistor R1' connected to each other in series, wherein the second pull-up resistor R1' has a resistive value different from that of the first pull-up resistor R1. The first node is connected to a power supply voltage VDD. The third branch 63 has a first input voltage control circuit W1 and a third switch K2 connected to each other in series. The fourth branch 64 is connected in parallel with the third branch 63 between a third node and a fourth node. The fourth branch 64 has a second input voltage control circuit W1' and a fourth switch K2' connected to each other in series. The second input voltage control circuit W1' has an effective low threshold voltage level different from that of the first input voltage control circuit W1. The third node is a row output port O3 of the row scan-port circuit 6. The signal generated from the row output port O3 of the row scan-port circuit 6 is processed by a processing module and is further transmitted to the host 14 depicted in FIG. 1B. The second node and the fourth node are connected to a signal input port 13 of the row scan-port circuit 6 to receive an input signal generated from the key circuit (S1-S144) depicted in FIG. 1B.

The traditional keyboard scan circuit is used for the traditional silver paste membrane keyboard. For example, in the traditional keyboard scan circuit, the power supply voltage VDD is 5V, the resistance of the pull-up resistor of the row scan-port circuit is 20K, the resistance of the scan line on the silver paste membrane is less than 2K and the effective input low voltage level is 1V. When the column scan-port generates a low voltage level, a divided voltage is generated because of the presence of the resistance of the scan line on the silver paste and the pull-up resistor of the row scan-port circuit. The voltage level received by the row scan-port is about 0.46V, which is smaller than the effective low threshold voltage level of the input port. Hence, the row scan-port circuit can receive the correct low voltage level. If the traditional keyboard scan circuit is used for the carbon paste membrane keyboard, the power supply voltage VDD is 5V, the resistance of the pull-up resistor of the row scan-port circuit is 20K, the resistance of the scan line on the carbon paste membrane is less than 300K and the effective input low voltage level is 1V. When the column scan-port generates a low voltage level, a divided voltage is generated because of the presence of the resistance of the scan line on the carbon paste and the pull-up resistor of the row scan-port circuit. The voltage level received by the row scan-port is about 4.7V, which is larger than the effective low threshold voltage level of the input port. Hence, the row scan-port circuit is not able to receive the correct low voltage level.

Hence, the membrane keyboard scan circuit in the present disclosure is able to determine the type of the membrane keyboard that the membrane keyboard scan circuit is currently connected to. In the present embodiment, the carbon paste membrane keyboard and the silver paste membrane keyboard are used as an example. When the membrane keyboard scan circuit determines that the membrane keyboard is a carbon paste membrane keyboard, the first switch K1 and the third switch K2 are controlled to be close and the second switch K1' and the fourth switch K2' are controlled to be open such that the first select branch is selected. In other words, the first pull-up resistor R1 is selected as the pull-up resistor of the input port (e.g. the ports P0-P7 depicted in FIG. 1A) and the first input voltage control circuit W1 is selected to control the threshold voltage of the input port. In an embodiment, the resistance of the first pull-up resistor R1 ranges from 500K to 2 M ohm, and the highest effective input low voltage level V1 of the input port P of the first input voltage control circuit ranges from 1.5V to 3V. In an embodiment, the first input voltage control circuit W1 can be implemented by a Schmitt circuit, a comparator circuit, an inverter circuit or a buffer circuit to control the input voltage level.

Consequently, if the power supply voltage VDD is 5V, the resistance of the first pull-up resistor R1 of the row scan-port circuit is 1 M ohm, the resistance of the scan line on the carbon paste membrane is less than 300K and the effective input low voltage level V1 of the first input voltage control circuit W1 is 2V, a divided voltage is generated when the column scan-port generates a low voltage level because of the presence of the resistance of the scan line on the carbon paste and the first pull-up resistor R1 of the row scan-port circuit. The voltage level received by the row scan-port is about 1.15V, which is smaller than the effective low threshold voltage level of the input port. Hence, the row scan-port circuit is not able to receive the correct low voltage level. Due to the large resistance of the scan line on the carbon paste, a good anti-interference characteristic can be maintained.

When the membrane keyboard scan circuit determines that the membrane keyboard is a silver paste membrane, the second switch K1' and the fourth switch K2' are controlled to be close and the first switch K1 and the third switch K2 are controlled to be open such that the second select branch is selected. In other words, the second pull-up resistor R1' is selected as the pull-up resistor of the input port (e.g. the ports P0-P7 depicted in FIG. 1A) and the second input voltage control circuit W1' is selected to control the threshold voltage of the input port. In an embodiment, the resistance of the second pull-up resistor ranges from 5K to 50K ohm. The highest effective input low voltage level V3 of the input port of the second input voltage control circuit ranges from 0.5V to 2V. In an embodiment, the second input voltage control circuit W1' can be implemented by a Schmitt circuit, a comparator circuit, an inverter circuit or a buffer circuit to control the input voltage level.

Consequently, if the power supply voltage VDD is 5V, the resistance of the second pull-up resistor R1' of the row scan-port circuit is 20K, the resistance of the scan line on the silver paste membrane is less than 2K and the effective input low voltage level V3 of the second input voltage control circuit W1' is 1V, a divided voltage is generated when the column scan-port generates a low voltage level because of the presence of the resistance of the scan line on the silver paste and the second pull-up resistor R1' of the row scan-port circuit. The voltage level received by the row scan-port is about 0.46V, which is smaller than the effective low threshold voltage level of the input port. Hence, the row scan-port circuit can receive the correct low voltage level.

Figure 8:
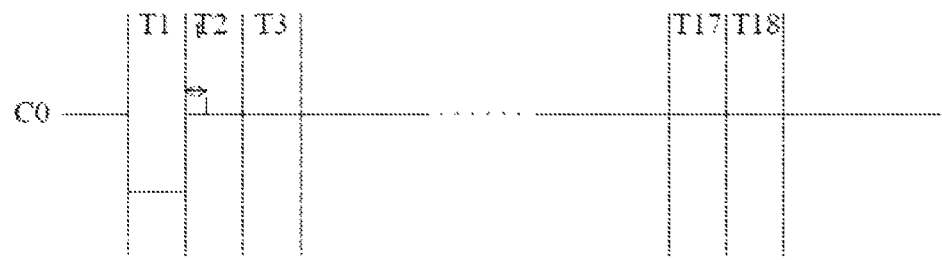
FIG. 8 is a diagram of the scan waveform of a single column scan-port circuit.
Figure 9:
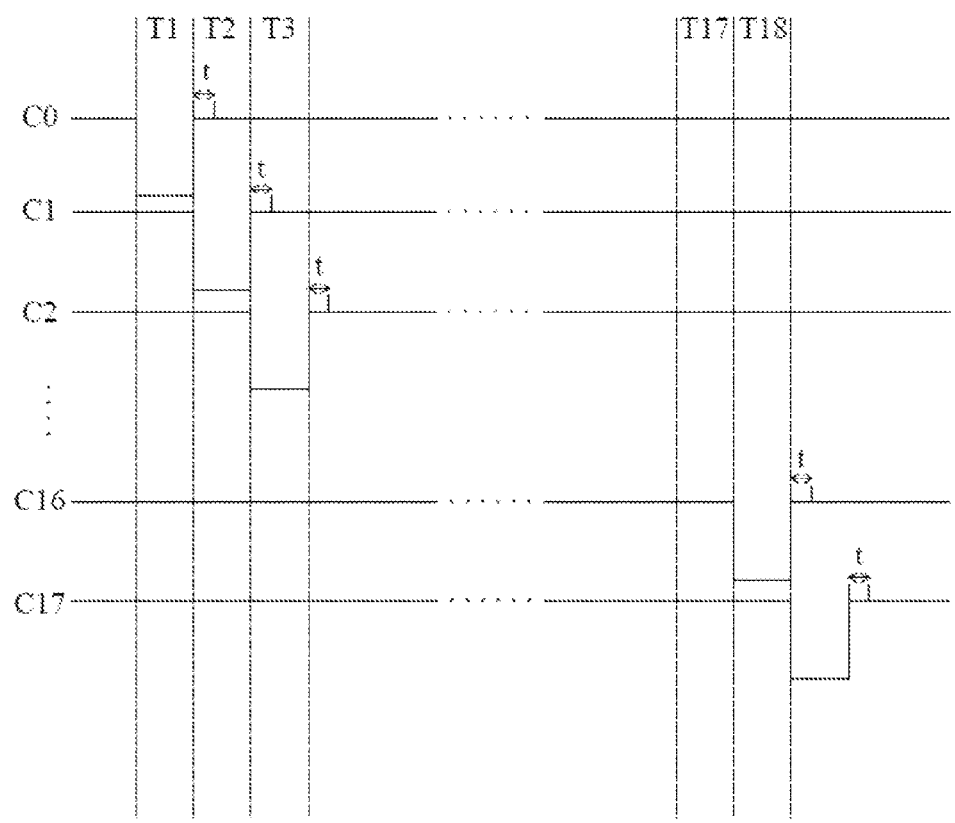
FIG. 9 is a diagram of the scan waveform of a plurality of column scan-port circuits.

When the appropriate row scan-port circuit 6 is selected, the column scan-port circuit 5 is able to perform a scan output process repetitively. FIG. 8 is a diagram of the scan waveform of a single column scan-port circuit 5. FIG. 9 is a diagram of the scan waveform of a plurality of column scan-port circuits 5.

When the scan output process begins, the fifth switch 53 is controlled to be close and the sixth switch 55 is controlled to be open in a first time period T1 to output a low voltage level. In an embodiment, the first time period T1 is 40 μs. After the first time period T1, the fifth switch 53 is controlled to be close and the sixth switch 55 is controlled to be open in a second time period t to output a high voltage level. In an embodiment, the second time period is 10 μs. After the second time period t, the fifth switch 53 and the sixth switch 55 are both controlled to be open to keep the output port O4 of the column scan-port circuit 5 at the high level state through the third pull-up resistor 51. The single column scan-port control process described is performed on each column scan-port of the column scan-port circuit in turn, as shown in FIG. 9.

Accordingly, the column scan-port circuit 5 can provide a row-scan timing signal to the key circuit of the membrane keyboard such that one of the first select branch and the second select branch (depending on the type of the membrane) generates a sensing signal when the key circuit is triggered. When a key is operated, the row scan-port circuit 6 receives the corresponding low voltage level. The row scan-port circuit further transmits the sensing signal to the keyboard control chip 12 depicted in FIG. 1B. The sensing signal is then further encoded and is transmitted to a host 14.

Figure 7:
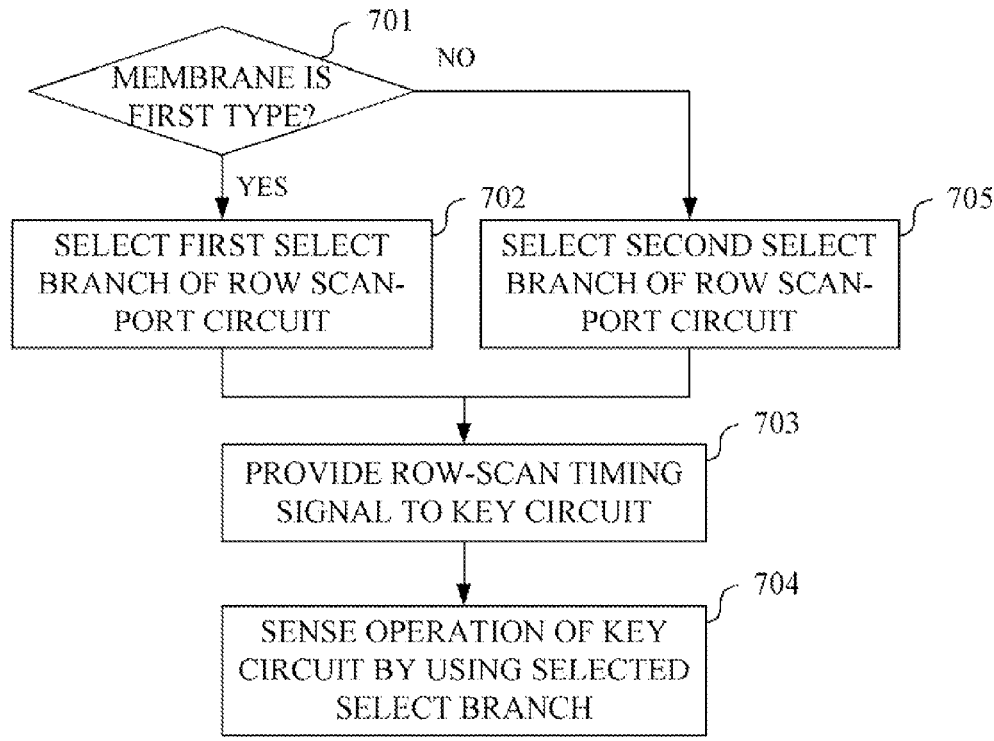
FIG. 7 is a flow chart of a scan method of a column scan-port circuit of a membrane keyboard in an embodiment of the present disclosure.

FIG. 7 is a flow chart of a scan method 700 of a column scan-port circuit of a membrane keyboard in an embodiment of the present disclosure.

As shown in FIG. 7, the scan method has the steps as outlined below.

In step 701, whether the type of the membrane of the membrane keyboard is the first type of the membrane is determined. In the present embodiment, the first type of the membrane is a carbon paste membrane. If the type of the membrane is the first type of the membrane, the first select branch of the row scan-port circuit 6 is selected in step 702.

In step 703, the column scan-port circuit 5 performs a scan output process repetitively to provide a row-scan timing signal to the key circuit of the membrane keyboard. In step 704, the selected select branch is used to sense the operation of the key circuit.

If the determination result in step 701 is that the type of the membrane of the membrane keyboard is the second type of the membrane instead of the first type of the membrane, the second select branch of the row scan-port circuit 6 is selected in step 705. Step 703 and step 704 is performed after step 705. In the present embodiment, the second type of the membrane is a silver paste membrane.

In order to lower the manufacturing cost of the keyboard, a carbon paste membrane is used since it is lower in cost than a silver paste membrane. However, the resistance of scan lines when a carbon paste membrane is used is larger than the resistance of scan lines when a silver paste membrane is used. In particular, the resistance of the scan lines when a silver paste membrane is used is generally less than 5K Ohm while the resistance of the scan lines is over 200K Ohm when a carbon paste membrane is used. Hence, the scan-port circuit and method adapted for use with the conventional silver paste membrane keyboard is not suitable for use with the carbon paste membrane keyboard. The membrane keyboard scan circuit can be adapted for use with both the carbon paste membrane keyboard and the silver paste membrane keyboard to addresses the issues mentioned above.

From the above description, it is evident that the membrane keyboard scan circuit of the present disclosure can be used for a silver paste membrane keyboard or a carbon paste membrane keyboard. Hence, more choice is provided than when using a conventional membrane keyboard scan circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A membrane keyboard scan circuit used in a membrane keyboard having a key circuit, wherein the membrane keyboard scan circuit comprises:
    a row scan-port circuit comprising:
        a first select branch configured to be close when the membrane keyboard is a first type of the membrane keyboard, wherein the first select branch comprises:
            a first branch comprising a first switch and a first pull-up resistor connected to each other in series; and
            a third branch comprising a first input voltage control circuit and a third switch connected to each other in series; and
        a second select branch configured to be close when the membrane keyboard is a second type of the membrane keyboard, wherein the second select branch comprises:
            a second branch connected in parallel with the first branch between a first node and a second node, wherein the second branch comprises a second pull-up resistor having a different resistive value from that of the first pull-up resistor and a second switch connected to each other in series, and wherein the first node is connected to a power supply voltage;
            a fourth branch connected in parallel with the third branch between a third node and a fourth node, wherein the fourth branch comprises a second input voltage control circuit and a fourth switch connected to each other in series, the third node is a row output port of the row scan-port circuit, the second node and the fourth node are connected to a signal input port that is further connected to the key circuit, and the second input voltage control circuit has a different effective low threshold voltage level from that of the first input voltage control circuit; and
    a column scan-port circuit comprising:
        a fifth switch connected between the power supply voltage and a column output port of the column scan-port circuit; and
        a sixth switch having a first end connected to ground and a second end connected to the column output port of the column scan-port circuit;
    wherein the column scan-port circuit performs a scan output process repetitively to output a low voltage level in a first specific time period through the use of the fifth switch and the sixth switch and to output and maintain a high voltage level after the first specific time period to provide a row-scan timing signal to the key circuit of the membrane keyboard such that one of the first select branch and the second select branch generates a sensing signal when the key circuit is triggered.

2. The membrane keyboard scan circuit of claim 1, wherein the first type of the membrane keyboard is a carbon paste membrane keyboard and the second type of the membrane keyboard is a silver paste membrane keyboard.

3. The membrane keyboard scan circuit of claim 2, wherein the resistance of the first pull-up resistor ranges from 500K to 2 M ohm and the resistance of the second pull-up resistor ranges from 5K to 50K ohm.

4. The membrane keyboard scan circuit of claim 2, wherein the highest effective low threshold voltage level of the first input voltage control circuit ranges from 1.5V to 3V and the highest effective input low voltage level of the second input voltage control circuit ranges from 0.5V to 2V.

5. The membrane keyboard scan circuit of claim 1, wherein the column scan-port circuit further comprises a third pull-up resistor connected in parallel with the fifth switch.

6. The membrane keyboard scan circuit of claim 1, wherein the fifth switch is controlled to be close and the sixth switch is controlled to be open such that the column scan-port circuit outputs the low voltage level in the first specific time period;
the fifth switch is controlled to be open and the sixth switch is controlled to be close such that the column scan-port circuit outputs the high voltage level in a second specific time period after the first specific time period; and
the fifth switch is controlled to be open and the sixth switch is controlled to be open such that the column scan-port circuit maintains the high voltage level after the second specific time period.

7. The membrane keyboard scan circuit of claim 1, wherein each of the first input voltage control circuit and the second input voltage control circuit is a Schmitt circuit, a comparator circuit, an inverter circuit or a buffer circuit.

8. The membrane keyboard scan circuit of claim 1, wherein the sensing signal is further encoded and is transmitted to a host.

9. A scan method for the membrane keyboard circuit of claim 1 comprising the steps of:
determining a type of a membrane of a membrane keyboard having the membrane keyboard circuit to generate a determination result;
selecting a select branch of the row scan-port circuit corresponding to the type of the membrane according to the determination result;
performing a scan output process repetitively by using the column scan-port circuit to output a low voltage level in a first specific time period through the use of the fifth switch and the six switch, outputting and maintaining a high voltage level after the first specific time period to provide the row-scan timing signal to a key circuit of the membrane keyboard; and
sensing the key circuit by using the selected select branch.

10. The scan method of claim 8, wherein when the membrane is a first type of the membrane keyboard, the step of selecting the select branch of the row scan-port circuit further comprises:
controlling the first select branch of the row scan-port circuit to be close and controlling the second select branch of the row scan-port circuit to be open.

11. The scan method of claim 9, wherein when the membrane is a second type of the membrane keyboard, the step of selecting the select branch of the row scan-port circuit further comprises:
controlling the first select branch of the row scan-port circuit to be open and controlling the second select branch of the row scan-port circuit to be close.

12. The scan method of claim 9, wherein the scan output process comprises the steps of:

controlling the fifth switch and the sixth switch such that the fifth switch is close and the sixth switch is open for a first time period;
controlling the fifth switch and the sixth switch such that the fifth switch is open and the sixth switch is dose for a second time period, and
controlling the fifth switch and the sixth switch such that the fifth switch is open and the sixth switch is open;
wherein the first time period and the second time period are constants.

13. A membrane keyboard comprising:
a key circuit;
a membrane keyboard scan circuit:
a row scan-port circuit comprising:
a first select branch configured to be close when the membrane keyboard is a first type of the membrane keyboard, wherein the first select branch comprises:
a first branch comprising a first switch and a first pull-up resistor connected to each other in series; and
a third branch comprising a first input voltage control circuit and a third switch connected to each other in series; and
a second select branch configured to be close when the membrane keyboard is a second type of the membrane keyboard, wherein the second select branch comprises:
a second branch connected in parallel with the first branch between a first node and a second node, wherein the second branch comprises a second pull-up resistor having a different resistive value from that of the first pull-up resistor and a second switch connected to each other in series, and wherein the first node is connected to a power supply voltage;
a fourth branch connected in parallel with the third branch between a third node and a fourth node, wherein the fourth branch comprises a second input voltage control circuit and a fourth switch connected to each other in series, the third node is a row output port of the row scan-port circuit, the second node and the fourth node are connected to a signal input port that is further connected to the key circuit, and the second input voltage control circuit has a different effective low threshold voltage level from that of the first input voltage control circuit; and
a column scan-port circuit comprising:
a fifth switch connected between the power supply voltage and a column output port of the column scan-port circuit; and
a sixth switch having a first end connected to ground and a second end connected to the column output port of the column scan-port circuit;
wherein the column scan-port circuit performs a scan output process repetitively to output a low voltage level in a first specific time period through the use of the fifth switch and the sixth switch and to output and maintain a high voltage level after the first specific time period to provide a row-scan timing signal to the key circuit of the membrane keyboard such that one of the first select branch and the second select branch generates a sensing signal when the key circuit is triggered.

14. The membrane keyboard of claim 13, wherein the first type of the membrane keyboard is a carbon paste membrane keyboard and the second type of the membrane keyboard is a silver paste membrane keyboard.

15. The membrane keyboard of claim 14, wherein the resistance of the first pull-up resistor ranges from 500K to 2 M ohm and the resistance of the second pull-up resistor ranges from 5K to 50K ohm.

16. The membrane keyboard of claim 14, wherein the highest effective low threshold voltage level of the first input voltage control circuit ranges from 1.5V to 3V and the highest effective input low voltage level of the second input voltage control circuit ranges from 0.5V to 2V.

17. The membrane keyboard of claim 13, wherein the column scan-port circuit further comprises a third pull-up resistor connected in parallel with the fifth switch.

18. The membrane keyboard of claim 13, wherein the fifth switch is controlled to be close and the sixth switch is controlled to be open such that the column scan-port circuit outputs the low voltage level in the first specific time period;
the fifth switch is controlled to be open and the sixth switch is controlled to be close such that the column scan-port circuit outputs the high voltage level in a second specific time period after the first specific time period; and
the fifth switch is controlled to be open and the sixth switch is controlled to be open such that the column scan-port circuit maintains the high voltage level after the second specific time period.

19. The membrane keyboard of claim 13, wherein each of the first input voltage control circuit and the second input voltage control circuit is a Schmitt circuit, a comparator circuit, an inverter circuit or a buffer circuit.

20. The membrane keyboard of claim 13, wherein the sensing signal is further encoded and is transmitted to a host.

* * * * *